United States Patent
Yeom

(10) Patent No.: US 7,391,105 B2
(45) Date of Patent: Jun. 24, 2008

(54) UNIT SEMICONDUCTOR CHIP AND MULTI CHIP PACKAGE WITH CENTER BONDING PADS AND METHODS FOR MANUFACTURING THE SAME

(75) Inventor: Kun-Dae Yeom, Cheonan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 242 days.

(21) Appl. No.: 10/834,083

(22) Filed: Apr. 29, 2004

(65) Prior Publication Data

US 2005/0046006 A1 Mar. 3, 2005

(30) Foreign Application Priority Data

Aug. 28, 2003 (KR) .............. 10-2003-0059834

(51) Int. Cl.
*H01L 21/48* (2006.01)
(52) U.S. Cl. .............. 257/686; 438/109; 438/613; 257/786; 257/E25.006
(58) Field of Classification Search ......... 257/686, 257/685
See application file for complete search history.

(56) References Cited

U.S. PATENT DOCUMENTS

| | | | | |
|---|---|---|---|---|
| 6,404,044 B2* | 6/2002 | Akram et al. | ...... | 257/686 |
| 6,407,448 B2* | 6/2002 | Chun | ...... | 257/678 |
| 6,445,064 B1* | 9/2002 | Ishii et al. | ...... | 257/686 |
| 6,876,074 B2* | 4/2005 | Kim | ...... | 257/686 |
| 7,026,709 B2* | 4/2006 | Tsai et al. | ...... | 257/686 |
| 2002/0027295 A1* | 3/2002 | Kikuma et al. | ...... | 257/780 |
| 2005/0104182 A1* | 5/2005 | Kim | ...... | 257/686 |

FOREIGN PATENT DOCUMENTS

| | | |
|---|---|---|
| JP | 2000-228468 | 8/2000 |
| KR | 10-2001-0027266 | 4/2001 |
| KR | 10-2001-0068514 | 7/2001 |
| KR | 2003-0029743 | 4/2003 |

OTHER PUBLICATIONS

Korean Patent Office Communication dated Jun. 29, 2005, for Korean Application No. 10-2003-0059834, with English Translation.

* cited by examiner

*Primary Examiner*—Leonardo Andujar
*Assistant Examiner*—Krista Soderholm
(74) *Attorney, Agent, or Firm*—Harness, Dickey & Pierce, P.L.C.

(57) ABSTRACT

A unit semiconductor chip and stacked semiconductor package and method of manufacturing with center bonding pads and at least one circuit layer to reduce the length of bonding. The unit semiconductor chip includes a first series of bonding wires connected to a plurality of center bonding pads of a semiconductor chip, at least one circuit layer connected to the first series of bonding wires and including a series of circuit layer wiring patterns, and a second series of bonding wires connecting the series of circuit layer wiring patterns and a series of wiring patterns. The stacked semiconductor package further includes a second series of wiring patterns, connected to the first series of wiring patterns, the a second series of wiring patterns and the series of circuit layer wiring patterns providing connections to adjacent lower and upper unit semiconductor packages, respectively.

9 Claims, 4 Drawing Sheets

UNIT SEMICONDUCTOR CHIP AND MULTI CHIP PACKAGE WITH CENTER BONDING PADS AND METHODS FOR MANUFACTURING THE SAME

CROSS REFERENCE TO RELATED APPLICATIONS

This application claims priority from Korean Patent Application No. 2003-59834, filed Aug. 28, 2003, the contents of which are hereby incorporated herein by reference in their entirety.

BACKGROUND OF THE INVENTION

1. Field of the Invention

The present invention relates generally to a unit semiconductor chip, semiconductor package and methods for manufacturing the same. More particularly, the present invention relates to a unit semiconductor chip and a stacked semiconductor package having semiconductor chips with center bonding pads and methods for manufacturing the same.

2. Description of Related Art

As a result of developments in semiconductor technology and user demands, the electronic industry has been engaged in continuing efforts to reduce the size, thickness and power consumption of semiconductor devices. In order to meet the requirement of the electronic industry, semiconductor devices are becoming more highly integrated. A conventional semiconductor package using solder balls instead of connecting pins is a ball grid array (BGA) package and a conventional packaging process have been generally for integrated semiconductor packages, such as chip scale packages (CSPs).

Demand for compact semiconductor devices with larger capacity has resulted in the development of stacked semiconductor packages. In general, stacked semiconductor packages have been adopted because of the possibility of easily increasing the memory capacity of a semiconductor package by two or more, by stacking two or more packages.

FIG. 1 is a cross-sectional view of a conventional BGA package 10 having a semiconductor chip 20 with center bonding pads 25. As illustrated in FIG. 1, the conventional BGA package 10 including a semiconductor chip 20 with center bonding pads 25 may include a printed circuit board 11 including wiring patterns 13 formed on the peripheral area of the printed circuit board 11. The semiconductor chip 20 with the center bonding pads 25 may be attached on a top side of the printed circuit board 11 by an adhesive layer 30. An insulating layer 28 may be formed in order to protect a circuit layer (not shown) on the semiconductor chip 20. The center bonding pads 25 and the wiring patterns 13 may be electrically connected by bonding wires 35. The semiconductor chip 20 and the bonding wires 35 may be sealed by an encapsulation 40. A plurality of solder ball pads 50 may be formed on the underside of the printed circuit board 11 and solder balls 55 may be attached corresponding to the plurality of solder ball pads 50. The solder balls 55 may be electrically connected to the wiring patterns 13 of the printed circuit board 11.

As described above, the conventional BGA package 10 may decrease a mounting density when connected to a mother board (not shown), as a result of using the printed circuit board 11, instead of a lead frame and using the solder balls 14 as external connection terminals. However, the conventional BGA package 10 including the semiconductor chip 20 with center bonding pads 25 has longer bonding wires 35 connecting the center bonding pads 25 and the wiring patterns 13 than semiconductor chips with edge pads. Further, electrical failures may occur between an edge portion of the semiconductor chip 20 and the bonding wires 36, as a result of reducing the height of the wire loop to reduce the overall thickness of the package. Furthermore, the conventional stacking process of manufacturing such a stacked semiconductor package may be difficult, as a result of sealing the top surface of the semiconductor chip 20 with the center bonding pads 25.

SUMMARY OF THE INVENTION

In an exemplary embodiment, the present invention provides a unit semiconductor chip with center bonding pads and at least one circuit layer to reduce the length of a bonding wire.

In another exemplary embodiment, the present invention provides a stacked semiconductor package with center bonding pads and at least one circuit layer to reduce the length of a bonding wire.

In another exemplary embodiment, the present invention provides a method of manufacturing a unit semiconductor chip. In another exemplary embodiment, the present invention provides a method of manufacturing a stacked semiconductor package.

According to exemplary embodiments, the present invention is directed to a stacked semiconductor package having an upper unit semiconductor package and a lower unit semiconductor package, each unit semiconductor package including a semiconductor chip with a plurality of center bonding pads mounted on a printed circuit board; at least one circuit layer having a plurality of wiring patterns attached to the semiconductor chip; and a plurality of external connection terminals formed on the printed circuit board. The unit semiconductor package may be electrically connected to the plurality of wiring patterns of the lower unit semiconductor package and the plurality of external connection terminals of the upper unit semiconductor package.

In an exemplary embodiment, the stacked semiconductor package may include the printed circuit board of the unit semiconductor package including a first surface and a second surface; a first series of wiring patterns being connected to the semiconductor chip and formed on the first surface; a second series of wiring patterns being connected to the plurality of external connection terminal and formed on the second surface. The first and second series of wiring patterns are electrically connected. In an exemplary embodiment, the circuit layers may be arranged beside the plurality of center bonding pads, respectively. In an exemplary embodiment, the circuit layer being a lead frame, a tape or a printed circuit board, the circuit layer may include at least one layer with the plurality of wiring patterns.

In an exemplary embodiment, the stacked semiconductor package may further include a first series of bonding wires being electrically connected to the circuit layer and the plurality of center bonding pads; and a second series of bonding wires being electrically connected to the circuit layer and the first series of wiring patterns. In an exemplary embodiment, an encapsulation may be partially sealed to protect the first and second series of bonding wires. In an exemplary embodiment, the plurality of external connection terminals may be formed by solder.

According to an exemplary embodiment, the present invention is directed to a stacked semiconductor package having an upper unit semiconductor package and a lower unit semiconductor package, each unit semiconductor package including a printed circuit board; a semiconductor chip with a plurality of center bonding pads mounted on the printed circuit board; at least one circuit layer having a plurality of wiring patterns arranged beside the plurality of center bonding pads on the semiconductor chip; a plurality of external connection terminals formed on the printed circuit board; a series of bonding wires being electrically connected to the printed circuit board and the circuit layer; an encapsulation partially sealed to protect the series of bonding wires; and a plurality of solder balls being electrically connected to the semiconductor chip and attached to the underside of the printed circuit board. The unit semiconductor package may be electrically connected to the plurality of wiring patterns of the lower unit semiconductor package and the plurality of external connection terminals of the upper unit semiconductor package.

In an exemplary embodiment, the printed circuit board of the unit semiconductor package may include a first surface and a second surface; a first series of wiring patterns being connected to the semiconductor chip and formed on the first surface; and a second series of wiring patterns being connected to the plurality of external connection terminal and formed on the second surface. The first and second series of wiring patterns may be electrically connected.

In an exemplary embodiment, a method of manufacturing a stacked semiconductor package may include providing a printed circuit board with a first and second series of wiring patterns, the first and second series of wiring patterns being formed to correspond on a first and second surface of the printed circuit board; attaching a semiconductor chip with a plurality of center bonding pads on the first surface; attaching at least one circuit layer being arranged beside the plurality of center bonding pads on the semiconductor chip; connecting a series of bonding wires correspond to the plurality of center bonding pads and the circuit layer, and between the first series of wiring patterns and the circuit layer; sealing a portion being connected the series of bonding wires by an encapsulation; attaching a plurality of solder balls being connected to the second series of wiring patterns on the second surface; and stacking unit semiconductor packages being formed. In an exemplary embodiment, the encapsulation may be sealed by the screen printing method. The method may further include stacking the series of wiring patterns of a lower unit semiconductor package being correspond to the plurality of solder balls of an upper unit semiconductor package.

In another exemplary embodiment, the present invention is directed to a unit semiconductor package including a first series of bonding wires connected to a plurality of center bonding pads of a semiconductor chip, at least one circuit layer connected to the first series of bonding wires and including a series of circuit layer wiring patterns, and a second series of bonding wires connecting the series of circuit layer wiring patterns and a series of wiring patterns.

In another exemplary embodiment, the present invention is directed to a stacked semiconductor package having an upper unit semiconductor package and a lower unit semiconductor package, each unit semiconductor package including a first series of bonding wires connected to a plurality of center bonding pads of a semiconductor chip, at least one circuit layer connected to the first series of bonding wires and including a series of circuit layer wiring patterns, a second series of bonding wires connecting the series of circuit layer wiring patterns and a first series of wiring patterns, and a second series of wiring patterns, connected to the first series of wiring patterns, the a second series of wiring patterns and the series of circuit layer wiring patterns providing connections to adjacent lower and upper unit semiconductor packages, respectively.

In another exemplary embodiment, the present invention is directed to a method of manufacturing a unit semiconductor package including connecting a first series of bonding wires to a plurality of center bonding pads of a semiconductor chip, connecting at least one circuit layer to the first series of bonding wires, connecting a series of circuit layer wiring patterns of the at least one circuit layer to a second series of bonding wires, and connecting the second series of bonding wires to a first series of wiring patterns.

In another exemplary embodiment, the present invention is directed to a method of manufacturing a stacked semiconductor package further including connecting a second series of wiring patterns to the first series of wiring patterns and connecting adjacent lower and upper unit semiconductor packages to the second series of wiring patterns and the series of circuit layer wiring patterns, respectively.

Various exemplary embodiments of the present invention may reduce or prevent electrical failures between the semiconductor chip and the bonding wires.

BRIEF DESCRIPTION OF THE DRAWINGS

The present invention will become more readily apparent through the following detailed description of exemplary embodiments of the present invention, made with reference to the attached drawings, in which.

DETAILED DESCRIPTION OF EXEMPLARY EMBODIMENTS

The present invention will now be described more fully with reference to the accompanying drawings, in which exemplary embodiments of the invention are shown. It should be understood, however, that exemplary embodiments of the present invention described herein can be modified in form and detail without departing from the spirit and scope of the invention. Accordingly, the exemplary embodiments described herein are provided by way of example and not limiting, and the scope of the present invention is not restricted to the exemplary embodiments described herein.

Figure 1:
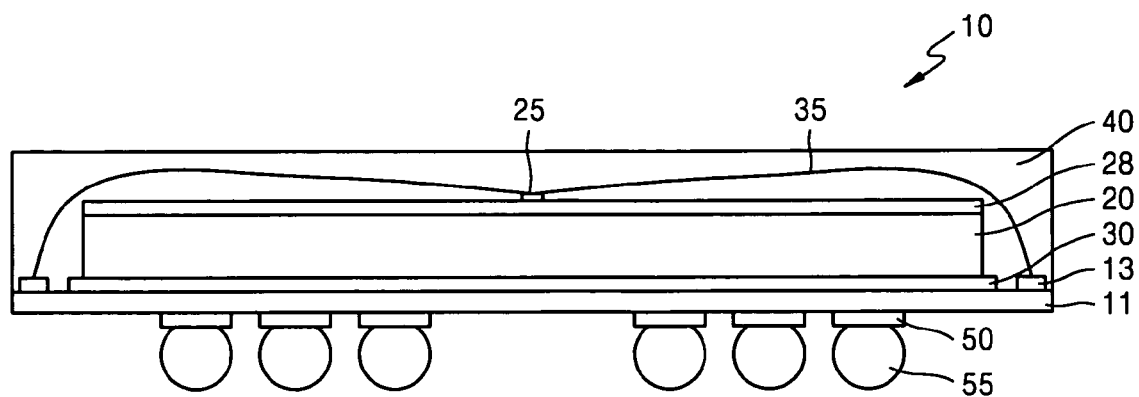
FIG. 1 is a cross-sectional view of a conventional BGA package having a semiconductor chip with center bonding pads.
Figure 2:
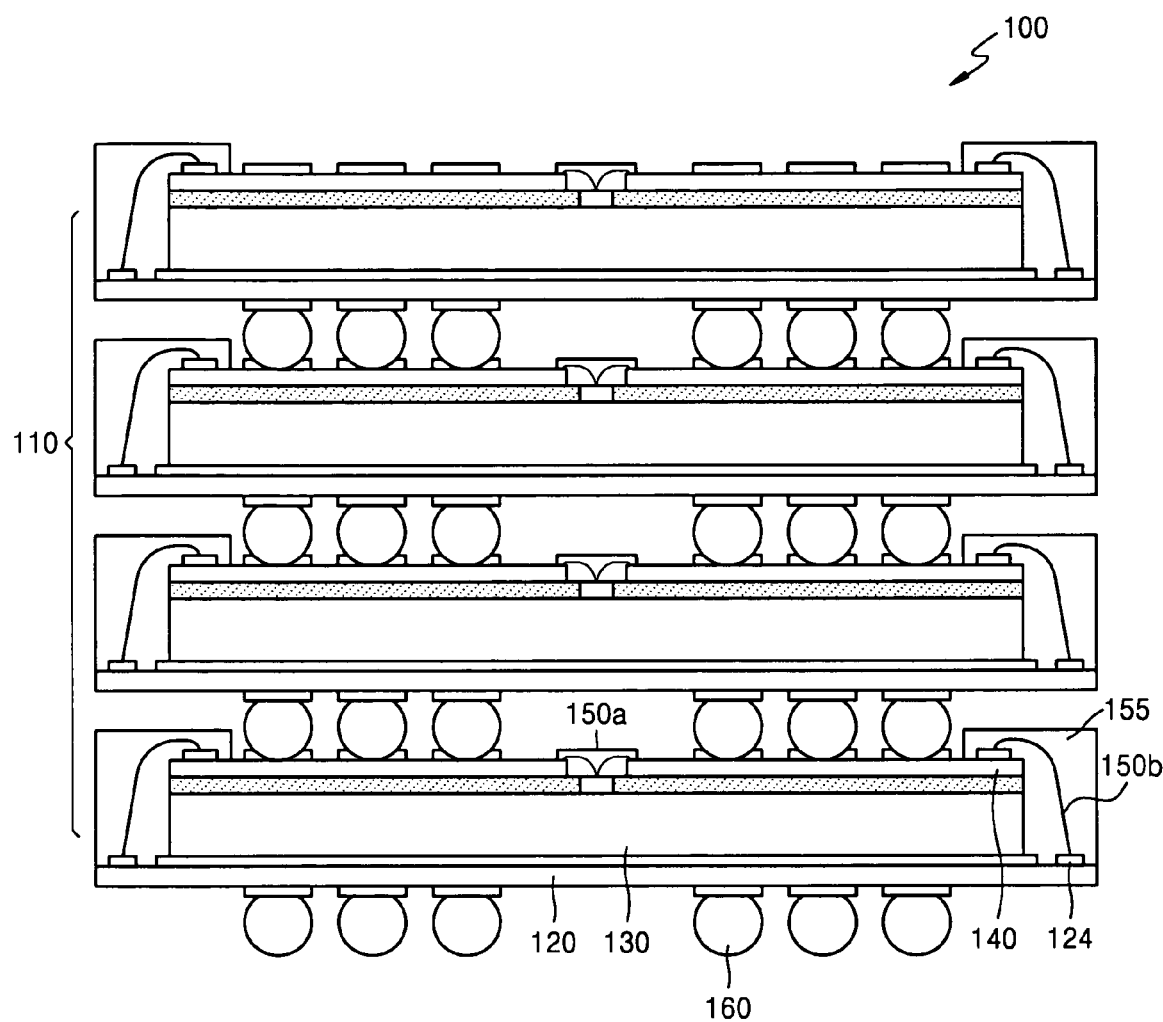
FIG. 2 is a cross-sectional view of a stacked semiconductor package having a semiconductor chip with center bonding pads according to an exemplary embodiment of the present invention.
Figure 3:
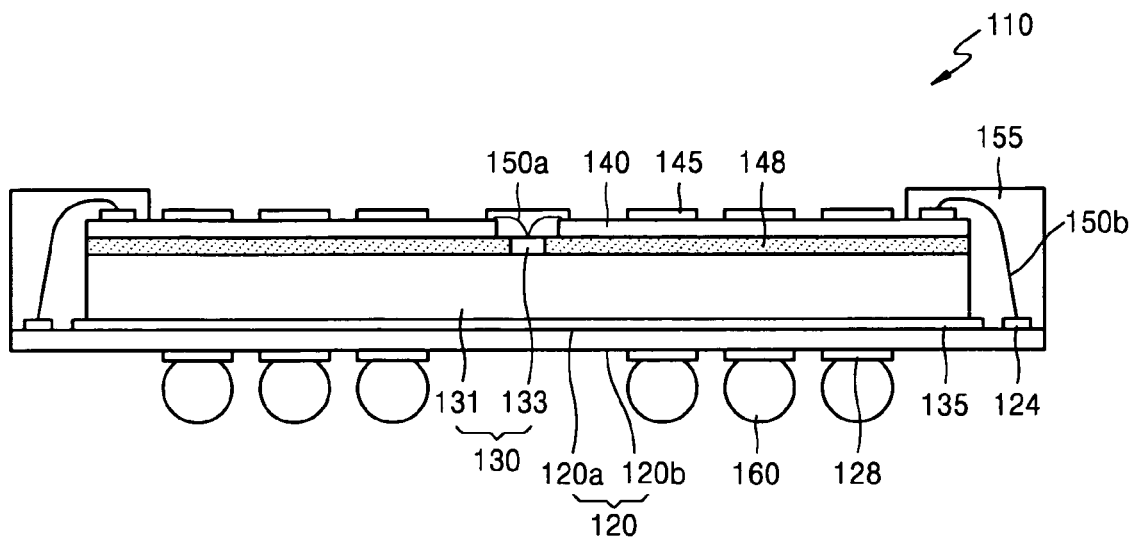
FIG. 3 is a cross-sectional view of a unit semiconductor package having a semiconductor chip with center bonding pads according to an exemplary embodiment of the present invention.

Referring to FIG. 2, according to an exemplary embodiment of the present invention, a stacked semiconductor package 100 may include at least one unit semiconductor package 110. The unit semiconductor package 110 may be the same or substantially similar to other unit semiconductor packages in the stacked semiconductor package 100. Referring to FIG. 3, the unit semiconductor package 110 may include a printed circuit board 120 with first and second surfaces 120a and 120b and a semiconductor chip 130 attached to the first 120a and/or 120b surface of the printed circuit board 120.

The printed circuit board 120 may act as an insulating plate, may further include first and second series of wiring patterns 124 and 128, formed on the first and second surfaces 120a and 120b, respectively. In addition, the first series of wiring patterns 124 may be arranged lateral to the semiconductor chip 130 and may be electrically connected to the semiconductor chip 130. The second series of wiring patterns 128 may be solder ball pads and arranged on the second surface 120a of the printed circuit board 120. Also, the first and second series of wiring patterns 124, 128 may be electrically connected via vertical through holes (not shown) of the printed circuit board 120.

As illustrated in FIG. 3, the semiconductor chip 130 includes center bonding pads 133 that are arranged on the center portion of an active layer, may include a silicon substrate 131 with a integrated circuit (not shown) on the active layer, the plurality of center bonding pads 133 and an insulating layer (not shown) being covered on the integrated circuit. Furthermore, the semiconductor chip 130 may be attached on the first surface 120a by a first adhesive layer 135.

A circuit layer 140 with a series of wiring patterns 145 may be attached on a top surface of the semiconductor chip 130, such as the top surface as shown in FIG. 3. In another exemplary embodiment, the circuit layer 140 may be a lead frame, a tape or a printed circuit board, including at least one layer including the series of wiring patterns 145. In an exemplary embodiment, the circuit layer 140 may be a single layer, in which each wiring pattern 145 is spaced apart from one another for electrical insulation. In another exemplary embodiment, the circuit layer 140 may include multiple layers, in which the series of wiring patterns 145 are insulated from each other with an insulating layer.

The circuit layer 140 may be attached to the semiconductor chip 130 by an adhesive layer 148, thereby allowing the center bonding pads 133 to be exposed. The adhesive layers 135, 148 may be of non-conductive adhesive material, for example, an epoxy or polymer composition. In another exemplary embodiment, the circuit layer 140 may be an adhesive tape; as a result an additional adhesive layer may not be necessary. The series of wiring patterns 145 may be exposed face up, thereby allowing solder balls 160 of an upper unit semiconductor package 110 to be placed thereon. In addition, a portion of the series of wiring patterns 145 may be arranged to correspond to the second series of wiring patterns 128, for example, solder ball pads, on the printed circuit board 120.

Referring to FIG. 3, the center bonding pads 133 may be electrically connected to the corresponding wiring patterns 145 by a first series of bonding wires 150a. Also, the first series of wiring patterns 124 may be connected to the series of wiring patterns 145 of the circuit layer 140 by a second series of bonding wires 150b. The first 150a and second 150b series of bonding wires may be sealed by an encapsulation 155. Solder balls 160 may be placed on the second series of wiring patterns 128, for example, solder ball pads.

In this manner, the unit semiconductor package 110 with the center bonding pads 133 may be connected to an upper and/or lower unit semiconductor packages 110, thereby allowing the corresponding solder balls 115 and wiring patterns 145 to be connected.

Hereafter, the method of manufacturing the stacked semiconductor package 100 according to exemplary embodiments of the present invention will be now described.

Figure 4A:
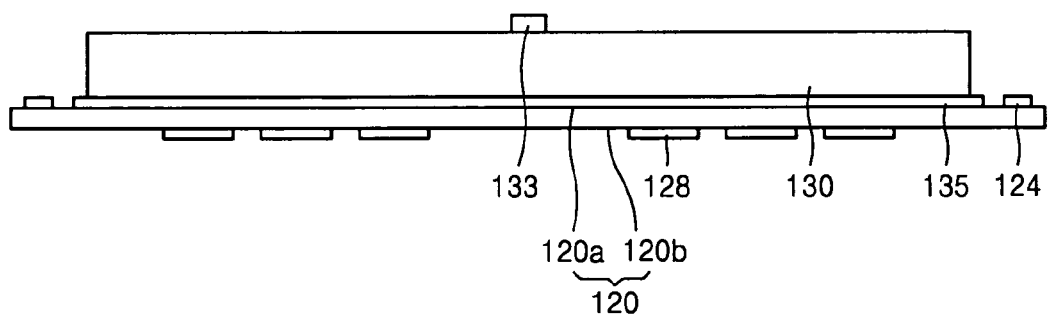
FIG. 4a shows a die bonding process according to an exemplary embodiment of the present invention.

As illustrated in FIG. 4a, the unit semiconductor package 110 may include the printed circuit board 120 with the first and second surfaces 120a, 120b. The first series of wiring patterns 124 may be formed on a peripheral area of the first surface 120a, thereby covering a conductive layer (not shown) and patterning a portion of the conductive layer on the printed circuit board 120. In addition, the second series of wiring patterns 128, for example, solder ball pads, may be formed on the second surface 120b of the printed circuit board 120, spaced apart at regular intervals. The adhesive layer 135 may be formed on the first surface 120a of the printed circuit board 120, in which the semiconductor chip 130 is attached by a thermo-compression method, for example. As described above, the semiconductor chip 130 with the center bonding pads 133 may be attached at a center area of the printed circuit board 120, thereby allowing the first series of wiring patterns 124 to be exposed.

Figure 4B:
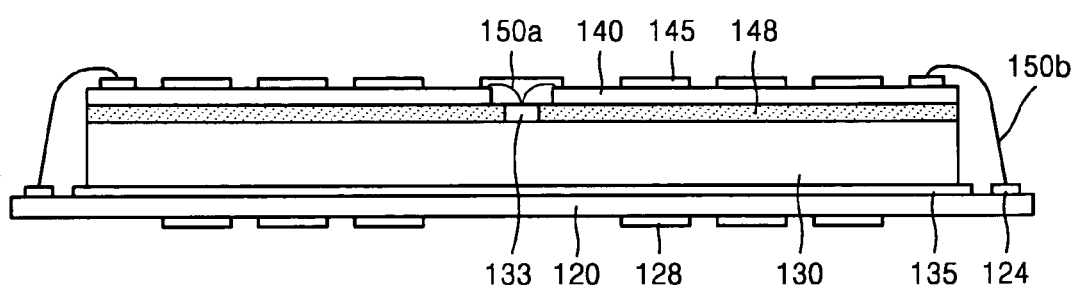
FIG. 4b shows a wire bonding process according to an exemplary embodiment of the present invention.

As illustrated in FIG. 4b, the circuit layer 140 may be attached on the semiconductor chip 130 by the adhesive layer 148. As described above, the circuit layer 140 may be a lead frame, a tape or a printed circuit board having the series of wiring patterns 145. Furthermore, at least one circuit layer 140 may then be attached to the semiconductor chip 130 so that the center bonding pads 133 are exposed. The first series of bonding wires 150a may be connected to the center bonding pads 133 and the circuit board 140 by a conventional forward method, for example. Also, the second series of bonding wires 150b may be connected to the corresponding first series of the wiring patterns 124 and the circuit board 140 by a conventional reverse method, for example. The circuit layer 140 may be electrically connected to the center bonding pads 133 and the printed circuit board 120, without the need for longer bonding wires.

Figure 4C:
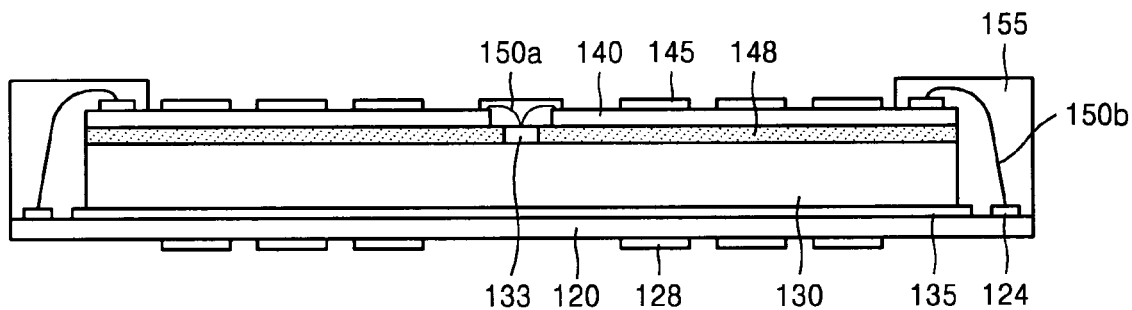
FIG. 4c shows a molding process according to an exemplary embodiment of the present invention.

As illustrated in FIG. 4c, the first and second series of bonding wires 150a, 150b may then be sealed for protection from the external environment by, for example, a screen printing method. The encapsulation may be an epoxy molding compound or other thermo-set and/or thermo-plastic polymer composition.

In an exemplary embodiment, the solder balls 160 with input/output functions may be soldered on the second series of wiring patterns 128, for example, solder ball pads, and thus the unit semiconductor package 110 may be completed, as shown in FIG. 3.

In an exemplary embodiment, the unit semiconductor packages 110 with the center bonding pads 133 may be stacked, as shown in FIG. 2. The solder balls 160 of an upper semiconductor package 110 may be connected to the corresponding wiring patterns 145 of a lower unit semiconductor package 110, thereby completing the stacked semiconductor package 100.

As described above, exemplary embodiment of the present invention may also use a semiconductor chip with center bonding pads for manufacturing the stacked semiconductor packages by using the circuit layers. Exemplary embodiment of the present invention may reduce the likelihood of electrical failures relative to using the longer bonding wires during the manufacture of stacked semiconductor packages.

Although the invention has been described with reference to various aspects and exemplary embodiments thereof, it will be apparent to those of ordinary skill in the art that various modifications and adaptations to the described exemplary embodiments may be made without departing from the spirit and scope of the invention as defined in the appended claims.

What is claimed is:

1. A stacked semiconductor package having an upper unit semiconductor package and a lower unit semiconductor package, each unit semiconductor package comprising:

a semiconductor chip with a plurality of center bonding pads mounted on a first printed circuit board;

at least one circuit layer including a plurality of wiring patterns attached to the semiconductor chip; and a plurality of external connection terminals formed on the first printed circuit board;

wherein each unit semiconductor package is electrically connected to the plurality of wiring patterns of a lower unit semiconductor package and the plurality of external connection terminals of an upper unit semiconductor package, and wherein the at least one circuit layer is a second printed circuit board, the at least one circuit layer including at least one layer with the plurality of wiring patterns.

2. The stacked semiconductor package of claim 1, wherein the first printed circuit board of the unit semiconductor package comprises:

a first surface and a second surface;

a first series of wiring patterns connected to the semiconductor chip and formed on the first surface;

a second series of wiring patterns connected to the plurality of external connection terminal and formed on the second surface;

wherein the first and second series of wiring patterns are electrically connected.

3. The stacked semiconductor package of claim 1, wherein each circuit layers is arranged adjacent the corresponding plurality of center bonding pads.

4. The stacked semiconductor package of claim 1, further comprising:

a first series of bonding wires electrically connected to the corresponding circuit layer and the plurality of center bonding pads; and a second series of bonding wires electrically connected to the corresponding circuit layer and the first series of wiring patterns.

5. The stacked semiconductor package of claim 4, further comprising an encapsulation partially sealed to protect the first and second series of bonding wires.

6. The stacked semiconductor package of claim 1, wherein the plurality of external connection terminals are formed by solder.

7. A stacked semiconductor package having an upper unit semiconductor package and a lower unit semiconductor package, each unit semiconductor package comprising:

a first printed circuit board;

a semiconductor chip with a plurality of center bonding pads mounted on the first printed circuit board;

at least one circuit layer including a plurality of wiring patterns arranged adjacent the plurality of center bonding pads on the semiconductor chip;

a plurality of external connection terminals formed on the first printed circuit board;

a series of bonding wires electrically connected to the first printed circuit board and the circuit layer;

an encapsulation partially sealed to protect the series of bonding wires; and a plurality of solder balls electrically connected to the semiconductor chip and attached to the first printed circuit board;

wherein each unit semiconductor package is electrically connected to the plurality of wiring patterns of a lower unit semiconductor package and the plurality of external connection terminals of an upper unit semiconductor package, and wherein the at least one circuit layer is a second printed circuit board, the at least one circuit layer including at least one layer with the plurality of wiring patterns.

8. The stacked semiconductor package of claim 6, wherein the first printed circuit board of the unit semiconductor package comprises:

a first surface and a second surface;

a first series of wiring patterns connected to the semiconductor chip and formed on the first surface; and a second series of wiring patterns connected to the plurality of external connection terminal and formed on the second surface;

wherein the first and second series of wiring patterns are electrically connected.

9. A stacked semiconductor package having an upper unit semiconductor package and a lower unit semiconductor package, each unit semiconductor package comprising:

a first series of bonding wires connected to a plurality of center bonding pads of a semiconductor chip;

at least one circuit layer connected to the first series of bonding wires and including a series of circuit layer wiring patterns;

a second series of bonding wires connecting the series of circuit layer wiring patterns and a first series of wiring patterns; and a second series of wiring patterns, connected to the first series of wiring patterns, the second series of wiring patterns and the series of circuit layer wiring patterns providing connections to adjacent lower and upper unit semiconductor packages, respectively, wherein the at least one circuit layer is a printed circuit board, the at least one circuit layer including at least one layer with the plurality of wiring patterns.

* * * * *